US005220219A

United States Patent [19]
Barber

[11] Patent Number: 5,220,219
[45] Date of Patent: Jun. 15, 1993

[54] ELECTRONICALLY CONTROLLED VARIABLE GAIN AMPLIFIER

[75] Inventor: Andrew C. Barber, Marina Del Rey, Calif.

[73] Assignee: Telerate Systems Incorporated, New York, N.Y.

[21] Appl. No.: 849,151

[22] Filed: Mar. 10, 1992

Related U.S. Application Data

[63] Continuation-in-part of Ser. No. 349,102, May 9, 1989, abandoned.

[51] Int. Cl.$^5$ .................... H03G 3/00; H03K 17/00
[52] U.S. Cl. .................... 307/493; 307/264; 307/353; 328/142; 328/151; 330/279
[58] Field of Search ............... 307/264, 353, 490, 491, 307/492, 493, 494; 328/142, 151; 330/129, 279

[56] References Cited

U.S. PATENT DOCUMENTS

| | | | |
|---|---|---|---|
| 3,845,398 | 10/1974 | Katz | 328/127 |
| 4,317,052 | 2/1982 | Morris | 307/261 |
| 4,334,195 | 6/1982 | Luce | 328/168 |
| 4,373,141 | 2/1983 | Sanders | 307/351 |
| 4,700,143 | 10/1987 | Anthony et al. | 328/151 |
| 4,785,250 | 11/1988 | Lawton | 328/127 |
| 4,886,986 | 12/1989 | Watanabe | 307/353 |

OTHER PUBLICATIONS

Intel-Advance Information, "80C196KB 16-Bit High Performance CHMOS Microcontroller"; p. 6-81; Oct. 88.
Interl-"80C196KB User's Guide"; pp. 4-36 through 4-37; 1988.

Primary Examiner—William L. Sikes
Assistant Examiner—Terry C. Cunningham
Attorney, Agent, or Firm—Roy J. Mankovitz

[57] ABSTRACT

An electronically controlled variable gain amplifier is disclosed which provides an output signal proportional to the value of an input signal multiplied by a gain factor, where the gain factor is in turn logarithmically proportional to the value of a gain control signal in the form of a digital word. The amplifier includes a capacitor, a sampler for periodically sampling the value of the input signal and storing the sampled value as a voltage on the capacitor, and circuits for periodically exponentially charging the capacitor after the input signal has been stored thereon for a duration which is directly proportional to the magnitude of the gain control signal. Also included is a circuit for periodically sampling and holding the voltage stored on the capacitor after each periodic charge, where the sampled and held voltage is the amplifier output signal.

3 Claims, 4 Drawing Sheets

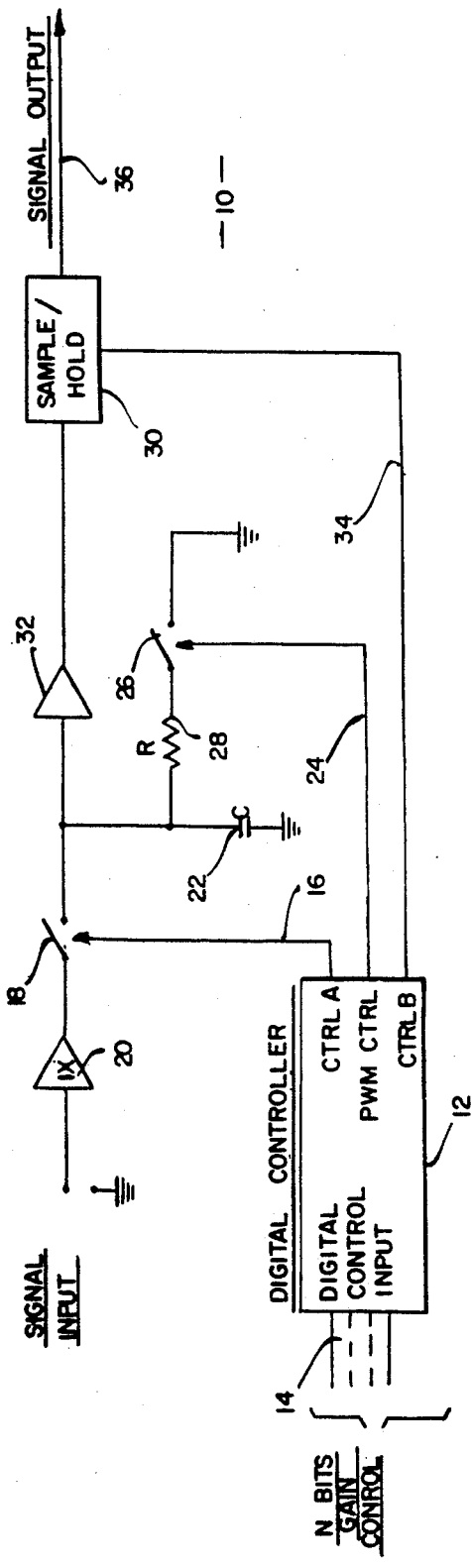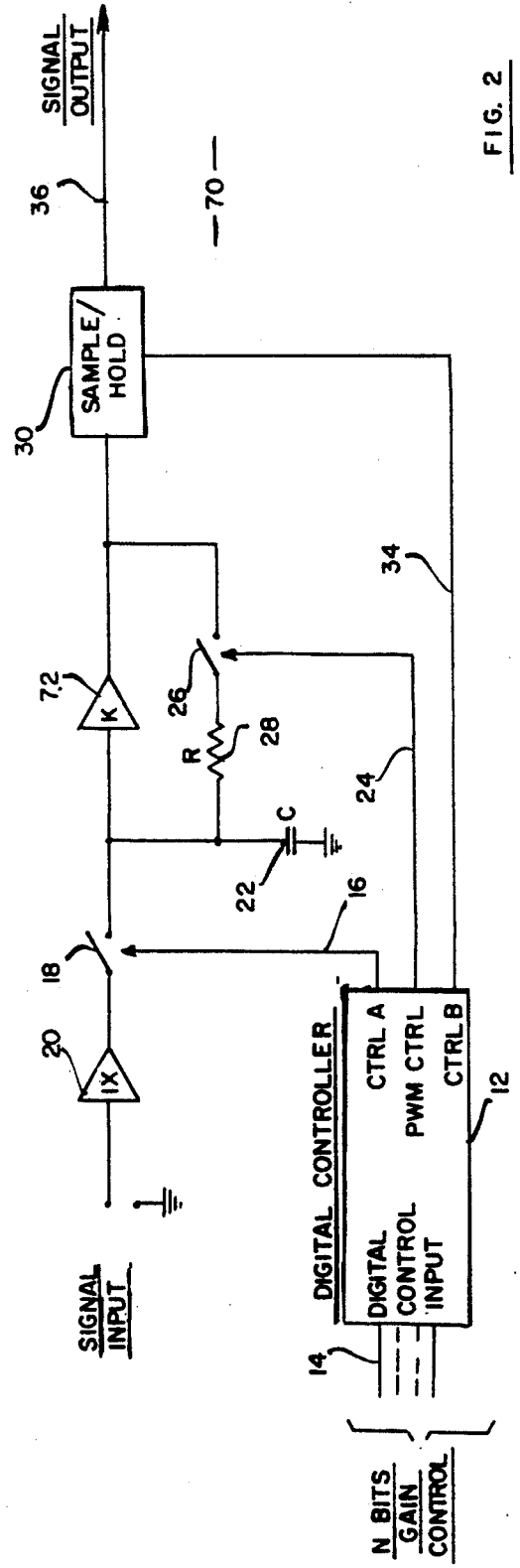

ELECTRONICALLY CONTROLLED VARIABLE GAIN AMPLIFIER

This is a continuation-in-part Ser. No. 07/349,102 filed on May 9, 1989 now abandoned.

BACKGROUND OF THE INVENTION

This invention relates to variable gain amplifiers and, more particularly, to an improved electronically controlled variable gain amplifier.

Over the years, a number of electronically controlled amplifier designs (hereinafter referred to as ECAs) have been conceived. Generally, these designs may be divided into two basic categories. The first category includes voltage controlled amplifiers (hereinafter referred to as VCAs) in which the gain is a function of an analog control signal.

While there are many textbook designs for VCAs, for the most part they all share several drawbacks, among which are the following. The absolute gain of a VCA is not very accurate, and hence a gain calibration is required in many applications. A further disadvantage is that a percentage of the control signal feeds through to the VCA signal output terminal. This feedthrough represents an error signal which must be compensated for in many application. Yet another disadvantage of VCAs is that in applications that require digital gain control (i.e. microprocessors), a D/A converter is required to convert the gain control word into an analog control signal.

A second category includes digitally controlled amplifiers (DCAs) which also possess several disadvantages. For example, one of the most popular DCA designs employs a multiplying CMOS D/A converter for linear gain control. However, if fine-step logarithmic gain control is required, a high resolution D/A converter and a log lookup table must be added, which substantially increases cost and complexity.

Another popular DCA design employs pulsewidth modulated amplifiers. A major drawback to this type of design is the limited gain resolution, resulting in unsuitability in applications requiring fine-step logarithmic gain control over a wide dynamic range.

Accordingly, it is an object of the present invention to provide a new and improved electronically controlled variable gain amplifier.

It is another object of the invention to provide an electronically controlled variable gain amplifier in which gain is digitally controlled in a logarithmic and intrinsically monotonic fashion.

It is yet another object of the invention to provide an electronically controlled variable gain amplifier in which the absolute gain accuracy and scale factor are controlled only by component tolerances, and in which there is no feedthrough of the control signal to the output signal.

SUMMARY OF THE INVENTION

The foregoing and other objects of the invention are accomplished by providing an electronically controlled variable gain amplifier which provides an output signal proportional to the value of an input signal multiplied by an attenuation factor, where the attenuation factor is in turn logarithmically proportional to the value of a gain control signal in the form of a digital word.

A controller is provided which generates a periodic series of clock signals and a sequence of three pulses during each clock signal interval. The sequence comprises a first pulse signal of fixed duration, a second pulse signal following the first pulse signal where the width of the second pulse signal is directly proportional to the value of the gain control signal, and a third pulse signal of fixed duration following the second pulse signal.

A capacitor is provided along with a sampling switch for periodically applying the input signal as a voltage to charge the capacitor in response to the first pulse signal, whereby the voltage across the capacitor represents a sample of the input voltage during the first pulse signal duration.

A resistor is provided along with a second switch for switching the resistor in parallel with the capacitor in response to and for the duration of the second pulse signal.

A sample and hold circuit is also provided for sampling and holding the voltage across the capacitor in response to the third pulse signal, where the sampled and held signal is the amplifier output signal.

In a second embodiment of the invention, an electronically controlled variable gain amplifier provides an output signal proportional to the value of an input signal multiplied by a gain factor, where the gain factor is in turn logarithmically proportional to the value of a gain control signal.

A controller is provided which generates a periodic series of clock signals and a sequence of three pulses during each clock signal interval. The sequence comprises a first pulse signal of fixed duration, a second pulse signal following the first pulse signal where the width of the second pulse signal is directly proportional to the value of the gain control signal, and a third pulse signal of fixed duration following the second pulse signal.

A capacitor is provided along with a sampling switch for periodically applying the input signal as a voltage to charge the capacitor in response to the first pulse signal, whereby the voltage across the capacitor represents a sample of the input voltage during the first pulse signal duration.

A gain block in the form of an amplifier is provided having an input terminal to which the capacitor voltage is applied, an output terminal and a gain of two.

A resistor is provided along with a second switch for connecting the resistor between the input and output terminals of the gain block in response to and for the duration of the second pulse signal.

A sample and hold circuit is also provided for sampling and holding the signal appearing at the output terminal of the gain block in response to the third pulse signal. The sampled and held signal is the amplifier output signal.

Other objects, features and advantages of the invention will become obvious from a reading of the specification in conjunction with the drawings, in which like reference designators refer to like elements throughout the several views.

BRIEF DESCRIPTION OF THE DRAWINGS

FIG. 1 is a block diagram of a first embodiment of the invention which provides an output signal proportional to the value of an input signal multiplied by an attenuation factor which is in turn logarithmically proportional to the value of a gain control signal in the form of a digital word;

FIG. 2 is a block diagram of a second embodiment of the invention which provides an output signal proportional to the value of an input signal multiplied by a gain factor which is in turn logarithmically proportional to the value of a gain control signal in the form of a digital word;

DESCRIPTION OF THE PREFERRED EMBODIMENTS

Figure 3:
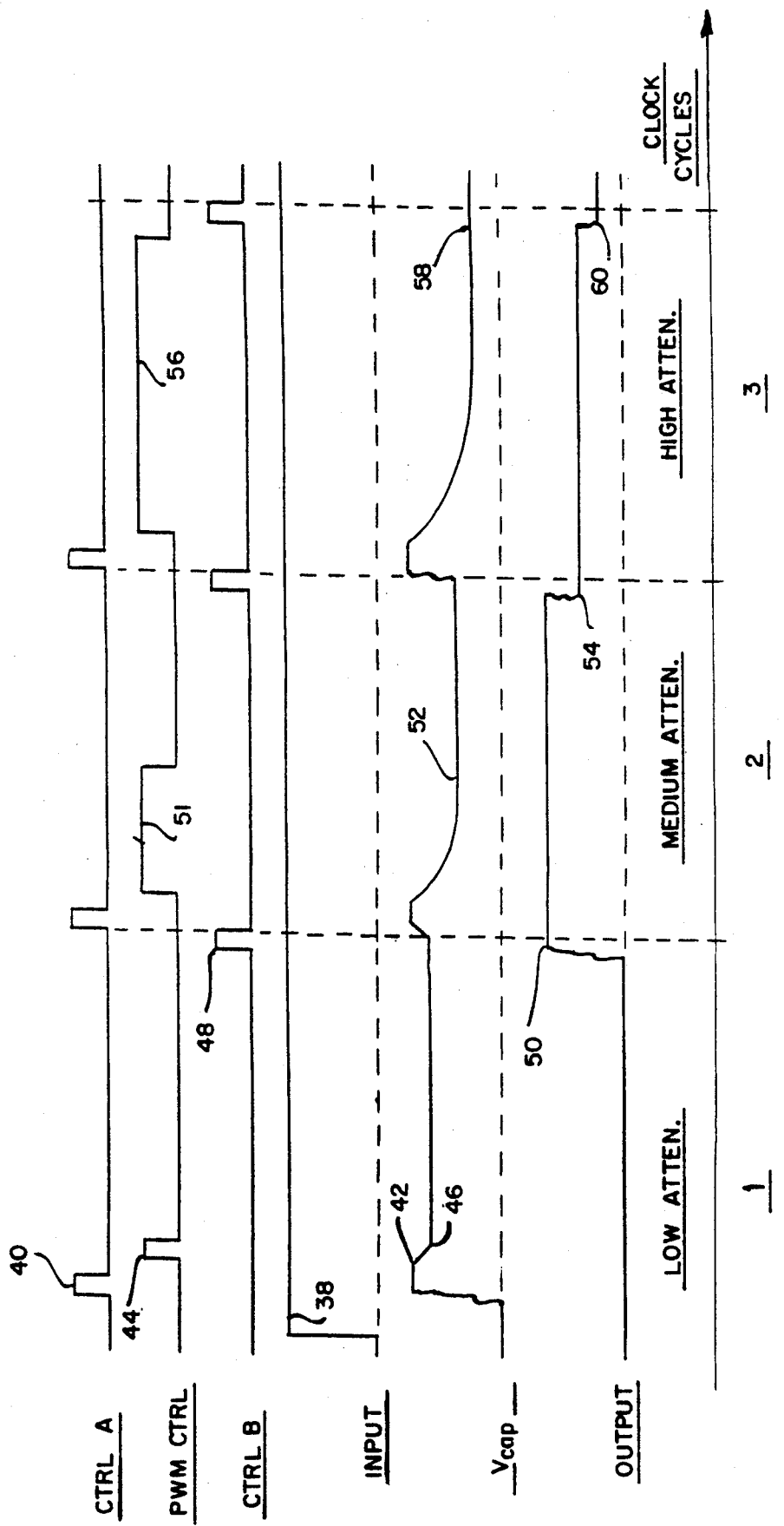
FIG. 3 is a series of graphs showing the waveforms of various signals for the embodiment shown in FIG. 1.

Referring to FIG. 1 there is shown a block diagram of a first embodiment 10 of the invention which provides an electronically controlled variable gain amplifier having an output signal proportional to the value of an input signal multiplied by an attenuation factor, where the attenuation factor is in turn logarithmically proportional to the value of a gain control signal in the form of an N bit digital word. To simplify understanding of the invention, the N bit digital word is represented herein by the term "gain control signal" which may be thought of as an analog signal equivalent to the N bit digital word. It will be appreciated that the N bit digital word can be derived, for example, by providing the equivalent analog signal to the input of an N bit analog-to-digital (A/D) converter (not shown), the output of which produces the N bit word.

The amplifier includes a digital controller 12 having input terminals 14 forming a bus to which is applied the gain control signal in the form of an N bit digital word. The controller 12 includes a clock circuit 13 which internally generates a periodic series of clock signals, and provides during each clock interval three output signals in the form of pulses.

The first output signal, labeled CTRL A in FIG. 1, appears as a fixed duration pulse on line 16. CTRL A is provided as a control signal to an analog switch 18. The input signal to the amplifier 10 is provided to one terminal of the switch 18 through a unity gain buffer 20, the purpose of which is to provide a low impedance signal. The other terminal of the switch 18 is connected to a capacitor 22.

The second output signal from the controller 12, labeled PWM CTRL (for pulse width modulation), is provided on line 24 as a control signal to a second analog switch 26 which is in series with a resistor 28. As shown in FIG. 1, closure of the switch 26 places the resistor 28 in parallel with capacitor 22. The second output signal is in the form of a variable width pulse which is initiated after the first output signal pulse has been completed. The width of the second signal (PWM CTRL) is directly proportional to the value of the gain control signal. Since the gain control signal is in the form of a digital word, the value, or magnitude, of that signal is the decimal value of the word. Hence, with respect to the PWM CTRL signal, the controller 12 acts as a digitally controlled pulse width modulator, described in more detail below.

The voltage appearing across the capacitor 22 is provided as an input signal to a sample and hold circuit 30 through a unity gain buffer 32. The sampling rate of the sample and hold circuit 30 is controlled from the controller 12 by a third signal, labeled CTRL B, which appears on line 34. The sampled and held signal appearing at output terminal 36 of the circuit 30 is the output signal of the amplifier circuit 10. The third signal is in the form of a fixed duration pulse which is initiated after the completion of the signal PWM CTRL.

The operation of the amplifier 10 described above is as follows. At the beginning of a clock interval, the controller 12 provides the fixed duration pulse CTRL A on line 16 to switch 18, which closes for that duration. Closure of switch 18 applies the input signal through buffer 20 to the capacitor 22. The low output impedance of the buffer 20 causes the capacitor 22 to rapidly charge to the input signal voltage.

At the completion of the pulse CTRL A, switch 18 opens and the controller 12 initiates the pulse PWM CTRL on line 24. As stated above, the duration (hereinafter referred to as T) of this pulse is directly proportional to the magnitude of the gain control signal appearing at the terminals 14. The pulse appearing on line 24 closes switch 26, which causes the capacitor 22 to exponentially discharge through the resistor 28. As shown below, the amount of capacitor discharge is related to the values of the capacitor (C) 22, the resistor (R) 28 and the pulse duration T.

At the completion of the PWM CTRL pulse, the switch 26 opens and the controller 12 provides the third signal CTRL B which initiates a sample and hold cycle by the circuit 30. The circuit 30 thus samples the voltage across the now partially discharged capacitor 22 and provides that voltage value on the line 36 as the output signal of the amplifier 10.

It may be shown that the transfer function or gain of the circuit 10 is given by:

$$\text{Gain} = V_{out}/V_{in} = e^{(-T/RC)} \tag{1}$$

Where $V_{in}$ is the input signal voltage, $V_{out}$ is the output signal voltage, R and C are the values of the resistor 28 and the capacitor 22, respectively, and T is the duration of the pulse PWM CTRL. Equation 1 may be rewritten in log form to express the gain in decibels:

$$\text{Gain(db)} = 20 \ln (e^{(-T/RC)})/\ln 10 \tag{2}$$

which may be simplified to:

$$\text{Gain(db)} = 8.68(-T/RC) \tag{3}$$

As stated above, T is directly proportional to the magnitude of the gain control signal. Accordingly, from equation 3 it may be seen that the gain of the circuit 10 is negative (representing attenuation) and is logarithmically proportional to the value of the gain control signal. Further, the attenuation scale factor accuracy and stability is solely dependent on the values and tolerances of R and C.

FIG. 3 is a graph of waveforms of several signals in the circuit 10 over three clock cycles showing the operation of the circuit 10 for three values of the gain control signal, with a constant input signal. The three gain control values correspond to settings for low, medium and high attenuation.

Referring to clock cycle 1 in FIG. 3, the input signal is held at a constant value as shown at point 38. The controller provides the CTRL A pulse at point 40, which causes the voltage across the capacitor ($V_{cap}$) to rise to the input voltage at point 42. The controller 12 then provides at point 44 the pulse PWM CTRL, whose width is proportional to the value of the gain control signal. This pulse causes the capacitor voltage to exponentially decrease as shown at point 46. At the completion of the pulse PWM CTRL, and near the end of the clock cycle, the controller 12 provides the pulse CTRL B at point 48. This pulse causes the circuit 30 to sample and hold the capacitor voltage as the output signal of the amplifier 10, as shown at point 50.

During clock cycle 2, the pulse sequences are repeated but with the magnitude of the gain control signal increased. Note the longer duration (T) of the pulse PWM CTRL as shown by line 51. The result is a deeper discharge of the capacitor as indicated at point 52, with a corresponding decrease in the output signal as shown at point 54.

During clock cycle 3, the pulse sequences are again repeated, with the magnitude of the gain control signal increased even further. Accordingly, the width of the pulse PWM CTRL is even longer as shown by line 56, the capacitor is discharged even further during this cycle (point 58) and the output signal is highly attenuated (point 60).

From the above description, it may be seen that the amplifier 10 provides an output signal proportional to the value of the input signal multiplied by an attenuation factor which is in turn logarithmically proportional to the value of the gain control signal.

While the circuit 10 provides variable attenuation (i.e. the circuit gain decreases with an increase in the gain control signal), there are applications where it is desirable to provide a circuit which provides variable gain (i.e. the circuit gain increases with an increase in the gain control signal). As shown below, this feature may be achieved by making small modifications to the circuit 10.

Referring to FIG. 2, there is shown a block diagram of a second embodiment 70 of the invention which provides an electronically controlled variable gain amplifier having an output signal proportional to the value of an input signal multiplied by a gain factor, where the gain factor is in turn logarithmically proportional to the value of a gain control signal.

The amplifier 70 is substantially similar to the amplifier 10, with the exception of two changes, which are as follows. First, the buffer 32 in FIG. 1 is replaced by a gain block (amplifier) 72 having a gain (K) greater than one. Second, the switch 26 in FIG. 1, which was connected to switch the resistor 28 in parallel with the capacitor 22 is instead connected to switch the resistor 28 between the input and output terminals of the gain block 72.

The operation of the circuit 70 is as follows. The controller 12, which operates in the same manner as in the circuit 10, provides during each clock interval the same three output signals previously described.

At the beginning of a clock interval, the controller 12 provides the fixed duration pulse CTRL A on line 16 to switch 18, which closes for that duration. Closure of switch 18 applies the input signal through buffer 20 to the capacitor 22. The low output impedance of the buffer 20 causes the capacitor 22 to rapidly charge to the input signal voltage.

At the completion of the pulse CTRL A, switch 18 opens and the controller 12 initiates the pulse PWM CTRL on line 24. As stated above, the duration (T) of this pulse is directly proportional to the magnitude of the gain control signal appearing at the terminals 14.

The pulse appearing on line 24 closes switch 26, which causes the capacitor 22 to exponentially charge through the resistor 28. As shown below, the amount of capacitor charge is related to the values of the capacitor (C) 22, the resistor (R) 28, the pulse duration T, and the gain K of the block 72.

At the completion of the PWM CTRL pulse, the switch 26 opens and the controller 12 provides the third signal CTRL B which initiates a sample and hold cycle by the circuit 30. The circuit 30 thus samples the voltage appearing at the output terminal of the gain block 72 and provides that voltage value on the line 36 as the output signal of the amplifier 10.

It may be shown that the transfer function or gain of the circuit 10 is given by:

$$\text{Gain} = V_{out}/V_{in} = e^{T(K-1)/RC} \times K \quad (4)$$

Where $V_{in}$ is the input signal voltage, $V_{out}$ is the output signal voltage, R and C are the values of the resistor 28 and the capacitor 22, respectively, T is the duration of the pulse PWM CTRL, and K is the gain of gain block 72. Equation 1 may be rewritten in log form to express the gain in decibels:

$$\text{Gain(db)} = 20 \ln (e^{T(K-1)/RC})/\ln 10 + 20 \log K \quad (5)$$

which may be simplified to:

$$\text{Gain(db)} = 8.68(T(K-1)/RC) + 20 \log K \quad (6)$$

As stated above, T is directly proportional to the magnitude of the gain control signal. Accordingly, from equation 3 it may be seen that the gain of the circuit 10 is positive and is logarithmically proportional to the value of the gain control signal. Further, the attenuation scale factor accuracy and stability is solely dependent on the values and tolerances of R, C and K.

It is interesting to note from equation 6 that for values of K greater than 1, the circuit 70 provides a gain factor, while for values of K less than 1, the circuit 70 provides an attenuation factor much like the circuit 10. For a value of K equal to 1, the circuit 70 no longer functions as a variable gain amplifier, but is instead a fixed gain amplifier. For a value of K equal to two, equation 6 conveniently simplifies to:

$$\text{Gain(db)} = 8.68(T/RC) + 6 \quad (7)$$

Figure 4:
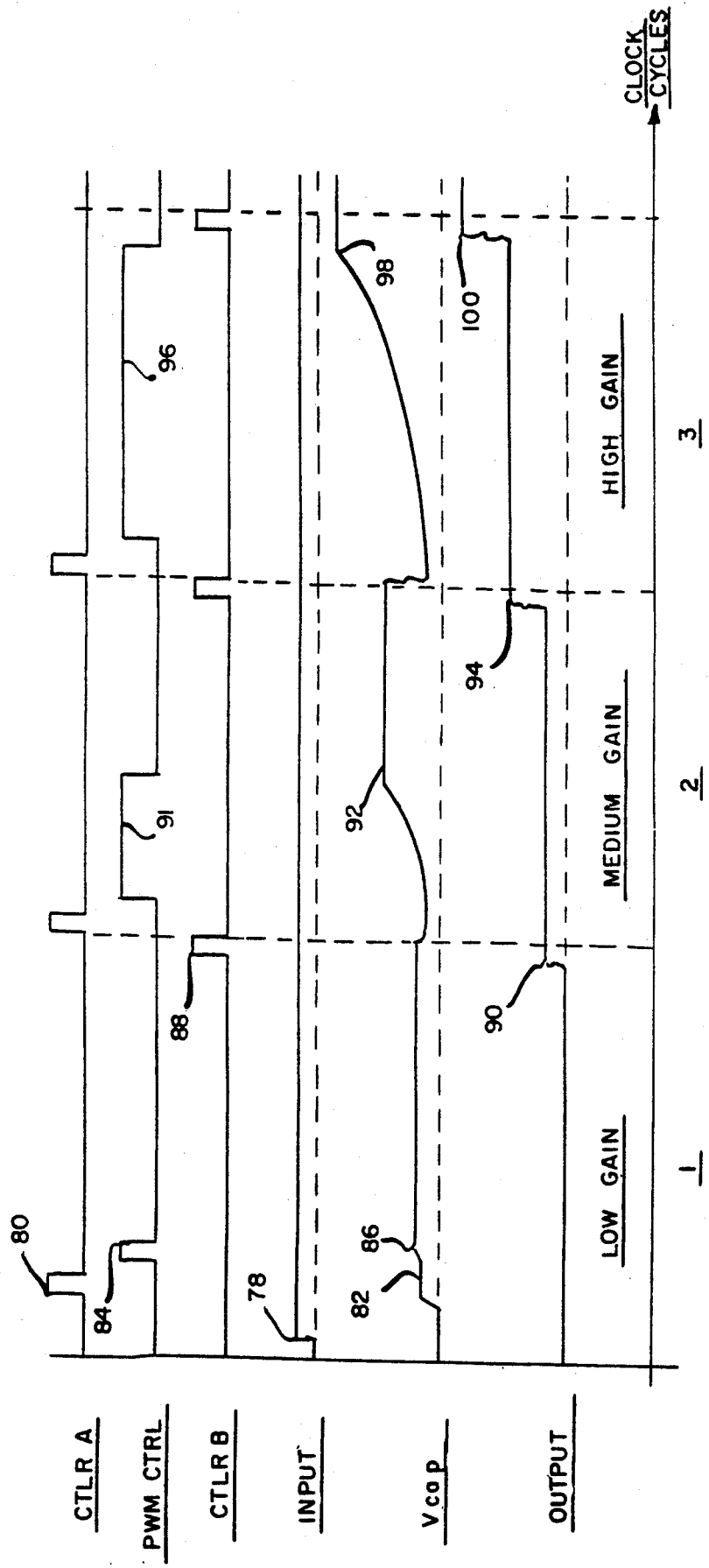
FIG. 4 is a series of graphs showing the waveforms of various signals for the embodiment shown in FIG. 2.

FIG. 4 is a graph of waveforms of several signals in the circuit 70 over three clock cycles showing the operation of the circuit 70 for three values of the gain control signal, with a constant input signal, and with the value of K greater than one. The three gain control values correspond to settings for low, medium and high gain.

Referring to clock cycle 1 in FIG. 4, the input signal is held at a constant value as shown at point 78. The controller provides the CTRL A pulse at point 80, which causes the voltage across the capacitor ($V_{cap}$) to rise to the input voltage at point 82. The controller 12 then provides at point 84 the pulse PWM CTRL, whose width is proportional to the value of the gain control signal. This pulse causes the capacitor voltage to exponentially increase as shown at point 86. At the completion of the pulse PWM CTRL, and near the end of the clock cycle, the controller 12 provides the pulse CTRL B at point 88. This pulse causes the circuit 30 to sample and hold the voltage at the output terminal of the gain block 72, as shown at point 90.

During clock cycle 2, the pulse sequences are repeated but with the magnitude of the gain control signal increased. Note the longer duration (T) of the pulse PWM CTRL as shown by line 91. The result is a greater charging of the capacitor 22 as indicated at point 92, with a corresponding increase in the output signal as shown at point 94.

During clock cycle 3, the pulse sequences are again repeated, with the magnitude of the gain control signal increased even further. Accordingly, the width of the pulse PWM CTRL is even longer as shown by line 96, the capacitor is charged even further during this cycle (point 98) and the output signal is even greater (point 100).

From the above description, it may be seen that the amplifier 70 provides an output signal proportional to the value of the input signal multiplied by a gain factor which is in turn proportional to the value of the gain control signal.

Figure 5:
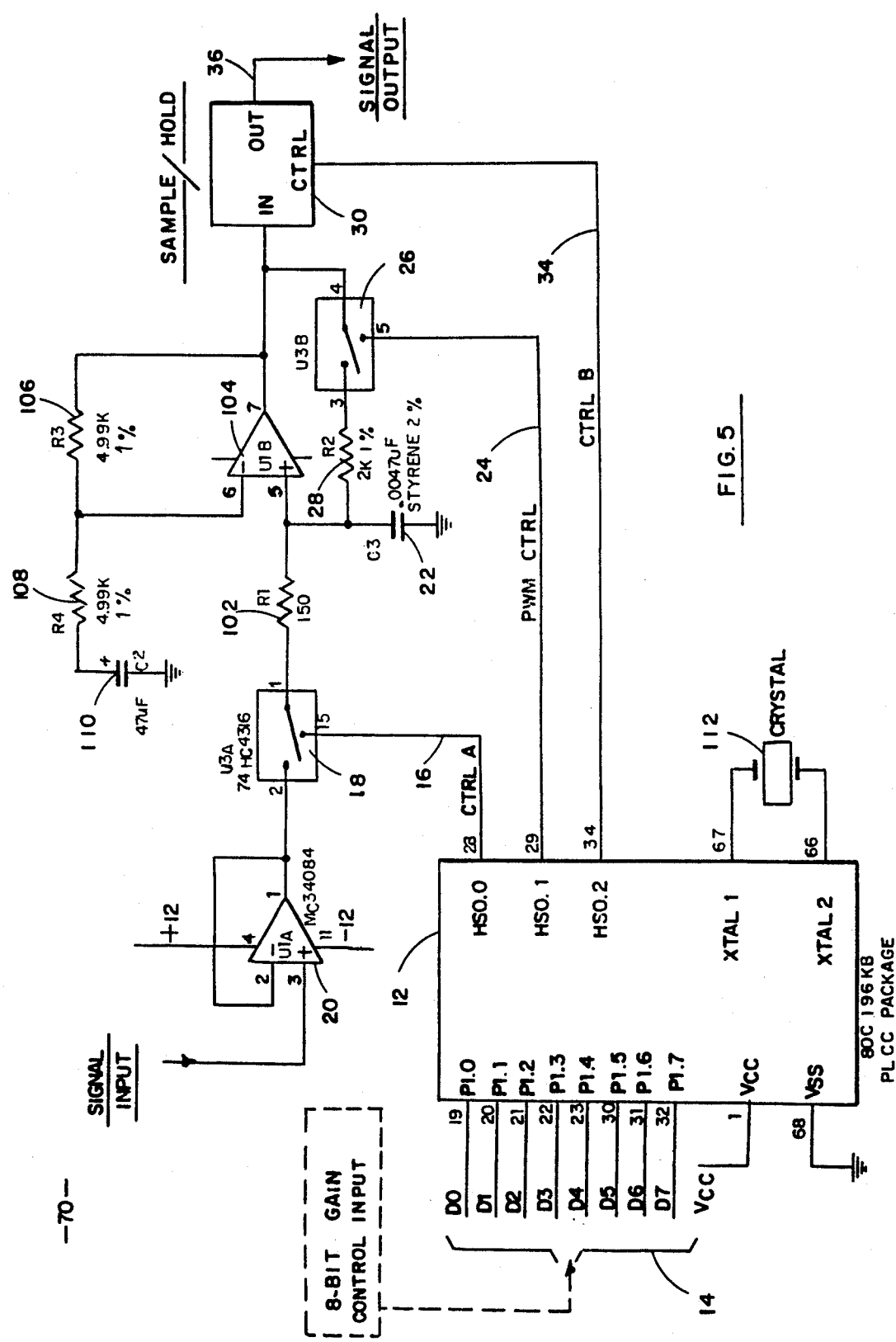
FIG. 5 is a schematic diagram showing the interconnections of the various circuit elements to construct the embodiment shown in FIG. 2.

FIG. 5 is a schematic diagram showing the interconnections of the various circuit elements to construct the amplifier circuit 70. Comparing FIG. 5 with FIG. 2, the input signal is provided to an input terminal of an operational amplifier connected for unity gain and which acts as the buffer 20 shown in FIG. 2. This operational amplifier may be one of a quad op amp circuit such as type MC34084, manufactured my Motorola, Inc., Phoenix, Ariz. The output terminal of the amplifier 20 is connected to an input terminal of analog switch 18, which may be one switch of a switch circuit such as type 74HC4316, manufactured by National Semiconductor Corp., Mountain View, Calif.

The output terminal of the switch 18 is connected through resistor 102 to operational amplifier 104, which may be similar in construction to the amplifier 20. The amplifier 104, in conjunction with resistors 102, 106 and 108 and capacitor 110 form the gain block 72 of FIG. 2. Capacitor 22, resistor 28, and analog switch 26 are connected to the amplifier 104 in the same fashion as shown in FIG. 2. The switch 26 may be of the same construction as the switch 18. The output terminal of the amplifier 104 is connected to the sample/hold input terminal of the sample/hold circuit 30, the output terminal of which is connected to the signal output terminal of the circuit 70.

The functions of the digital controller 12 are performed using a microcontroller such as the type 80C196KB, manufactured by Intel Corporation, San Jose, Calif. This type of microcontroller includes the clock circuit 13, which cooperates with a crystal 112 as a frequency reference to form a time base suitable for generating the CTRL A and CTRL B signals on lines 16 and 34, respectively, in a manner well known in the art. The microcontroller also includes a pulse width modulation circuit which is connected to generate the PWM CTRL signal on the line 24. An eight bit digital word representing the gain control signal is provided on the bus 14 to the controller 12 as shown. The programming of the controller 12 to perform all of the functions necessary to the operation of the circuit 70 is readily performed by one skilled in the art using the specifications provided for the 80C196KB, such specifications being incorporated by reference herein. It should be noted that the ample/hold function provided by the circuit 30 may also be advantageously performed by the microcontroller 12, as opposed to the use of a separate circuit 30.

It should also be noted that, while the circuit connections shown in FIG. 5 are those to produce the functions of the circuit 70, it will now be obvious to one skilled in the art to modify the circuit of FIG. 5 to perform the functions of the circuit 10 shown in FIG. 1.

It will also be apparent to those skilled in the art that the preceding descriptions of embodiments of the invention may be substantially varied to meet particular requirements without departing from the true spirit and scope of the invention disclosed. For example, while the circuits disclosed have been described in terms of variable gain amplifiers, they may also be used as analog signal multipliers. Therefore, the embodiments described are not to be taken as indicative of the limits of the invention but rather are exemplary structured of the invention which is defined by the claims appended hereto.

What is claimed is:

1. An electronically controlled variable gain amplifier which provides an output signal proportional to the value of an input signal multiplied by a gain factor, where the gain factor is in turn logarithmically proportional to the value of a digital word representing a gain control signal, comprising:

means responsive to the gain control signal for periodically providing a sequence of three pulses, the sequence including a first pulse signal of fixed duration, a second pulse signal following the first pulse signal where the width of the second pulse signal is directly proportional to the value of the digital word, and a third pulse signal of fixed duration following the second pulse signal;

a capacitor;

first sample means for applying the input signal as a voltage to charge the capacitor in response to the first pulse signal, whereby the voltage across the capacitor represents a sample of the input voltage during the first pulse signal duration;

gain means having an input terminal, an output terminal and a gain greater than one;

means for applying the voltage across the capacitor to the gain means input terminal;

a resistor;

switch means for switching the resistor between the input and output terminals of the gain means in response to and for the duration of the second pulse signal;

sample and hold means having a sample/hold input terminal for sampling and holding signals provided to the sample/hold input terminal in response to the third pulse signal, where the sampled and held signal is the amplifier output signal; and means for connecting the gain means output terminal to the sample/hold input terminal.

2. The amplifier of claim 1 where the gain means has a gain of two.

3. An electronically controlled variable gain amplifier which provides an output signal proportional to the value of an input signal multiplied by an attenuation factor, where the attenuation factor is in turn logarithmically proportional to the value of a digital word representing a gain control signal, comprising:

means responsive to the gain control signal for periodically providing a sequence of three pulses, the sequence including a first pulse signal of fixed duration, a second pulse signal following the first pulse signal where the width of the second pulse signal is directly proportional to the value of the digital word, and a third pulse signal of fixed duration following the second pulse signal;

a capacitor;

first sample means for applying the input signal as a voltage to charge the capacitor in response to the first pulse signal, whereby the voltage across the capacitor represents a sample of the input voltage during the first pulse signal duration;

gain means having an input terminal, an output terminal and a gain less than one;

means for applying the voltage across the capacitor to the gain means input terminal;

a resistor;

switch means for switching the resistor between the input and output terminals of the gain means in response to and for the duration of the second pulse signal;

sample and hold means having a sample/hold input terminal for sampling and holding signals provided to the sample/hold input terminal in response to the third pulse signal, where the sampled and held signal is the amplifier output signal; and means for connecting the gain means output terminal to the sample/hold input terminal.

* * * * *